(12) United States Patent
Iwasaki et al.

(10) Patent No.: US 7,745,258 B2
(45) Date of Patent: Jun. 29, 2010

(54) MANUFACTURING METHOD OF SEMICONDUCTOR DEVICE

(75) Inventors: Toshihiro Iwasaki, Tokyo (JP);
Michitaka Kimura, Tokyo (JP); Kozo Harada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 129 days.

(21) Appl. No.: 12/172,812

(22) Filed: Jul. 14, 2008

(65) Prior Publication Data

US 2008/0274590 A1 Nov. 6, 2008

Related U.S. Application Data

(63) Continuation of application No. 11/241,986, filed on Oct. 4, 2005, now Pat. No. 7,443,036.

(30) Foreign Application Priority Data

Dec. 21, 2004 (JP) ............................. 2004-369230

(51) Int. Cl.
*H01L 21/44* (2006.01)

(52) U.S. Cl. .............................. 438/108; 257/E21.503; 257/E21.508; 257/E21.511

(58) Field of Classification Search ................ 438/108; 257/E21.503, E21.508, E21.511
See application file for complete search history.

(56) References Cited

U.S. PATENT DOCUMENTS 5,784,261 A 7/1998 Pedder

| | | |
|---|---|---|
| 6,504,241 B1 | 1/2003 | Yanagida |
| 6,515,370 B2 | 2/2003 | Hashimoto |
| 7,122,906 B2 | 10/2006 | Doan |

FOREIGN PATENT DOCUMENTS

| | | |
|---|---|---|
| JP | 11-340270 | 12/1999 |
| JP | 2001-257310 A | 9/2001 |
| JP | 2001-308258 A | 11/2001 |
| JP | 2002-110726 A | 4/2002 |
| JP | 2003-59958 A | 2/2003 |
| JP | 2004-146728 | 5/2004 |
| JP | 2004-356655 A | 12/2004 |
| JP | 3963484 B2 | 8/2007 |
| WO | WO 98/40915 | 9/1998 |

OTHER PUBLICATIONS

Chin et al. "Breakthrough Ball Attach Technology by introducing Solder Paste Screen Printing." IEEE 2001 Electronic Components and Technology Conference.

*Primary Examiner*—Charles D Garber
*Assistant Examiner*—Stanetta D Isaac
(74) *Attorney, Agent, or Firm*—Oblon, Spivak, McClelland, Maier & Neustadt, L.L.P.

(57) ABSTRACT

A manufacturing method of the semiconductor device including a step of forming solder balls on the circuit face of a mother chip, a step of making flip chip bonding of the daughter chip after the step of forming solder balls on the circuit face of the mother chip, and a step of making flip chip bonding of the mother chip on a circuit board using the solder balls.

4 Claims, 7 Drawing Sheets

MANUFACTURING METHOD OF SEMICONDUCTOR DEVICE

CROSS-REFERENCE TO RELATED APPLICATIONS

This application is a continuation of and claims the benefit of priority under 35 U.S.C. §120 from U.S. application Ser. No. 11/241,986, filed Oct. 4, 2005 and claims the benefit of priority under 35 U.S.C. §119 from Japanese Patent Application No. 2004-369230, filed Dec. 21, 2004, the entire contents of all of which are incorporated herein by reference.

BACKGROUND OF THE INVENTION

1. Field of the Invention

The present invention relates to a manufacturing method of a semiconductor device which makes flip chip bonding of a daughter chip at a mother chip, and makes flip chip bonding of a mother chip on a circuit board further, and particularly relates to a manufacturing method of a semiconductor device which can efficiently form solder balls to be used in order to make flip chip bonding of the mother chip on the circuit board.

2. Background Art

In recent years, the semiconductor device which has the COC (chip on chip) structure having made flip chip bonding of a daughter chip at a mother chip, and which made flip chip bonding of the mother chip further at the circuit board is proposed (for example, refer to Japanese Unexamined Patent Publication No. 2004-146728). Conventionally, when manufacturing this semiconductor device, after making flip chip bonding of the daughter chip on the circuit face of a mother chip, solder balls were formed on the circuit face of a mother chip, and flip chip bonding of the mother chip was made on the circuit board using these solder balls.

There are many solder balls to connect a circuit board with a mother chip, and for example, it is 1000 or more pieces. Therefore, in order to form solder balls efficiently, it is necessary to use the solder ball formation method of single wafer processing collectively enforced to a plurality of mother chips formed on the wafer.

As a solder ball formation method of such single wafer processing, there are a method of applying the resist to the circuit face of a mother chip, and making opening of the resist filling up with solder paste, and a method of laying a metal mask on top of the circuit face of a mother chip, and filling up opening of the metal mask with solder paste.

However, when forming solder balls in the manufacturing process of a conventional COC type semiconductor device, a daughter chip is connected and the surface of a mother chip is not flat. Therefore, since the resist could not be applied uniformly, and it was also difficult to process a thin metal mask according to the surface irregularity, the solder ball formation method of the above-mentioned single wafer processing was not able to be used.

SUMMARY OF THE INVENTION

The present inventions are made to solve the above problems, and the purpose is to obtain a manufacturing method of a semiconductor device which can efficiently form solder balls used in order to make flip chip bonding of a mother chip on a circuit board.

A manufacturing method of a semiconductor device of the present invention comprises the steps of: forming solder balls on a circuit face of a mother chip; making flip chip bonding of a daughter chip on the circuit face of the mother chip after the step forming solder balls; and making flip chip bonding of the mother chip on a circuit board using the solder balls. The other features of the present invention are made clear to below.

Since the present invention forms solder balls in the phase with little irregularity before making flip chip bonding of the daughter chip on the circuit face of a mother chip, the solder ball formation method of single wafer processing can be used for it. For this reason, the solder balls used in order to make flip chip bonding of the mother chip on the circuit board can be formed efficiently.

DETAILED DESCRIPTION OF THE PREFERRED EMBODIMENTS

Embodiment 1

Figure 1:
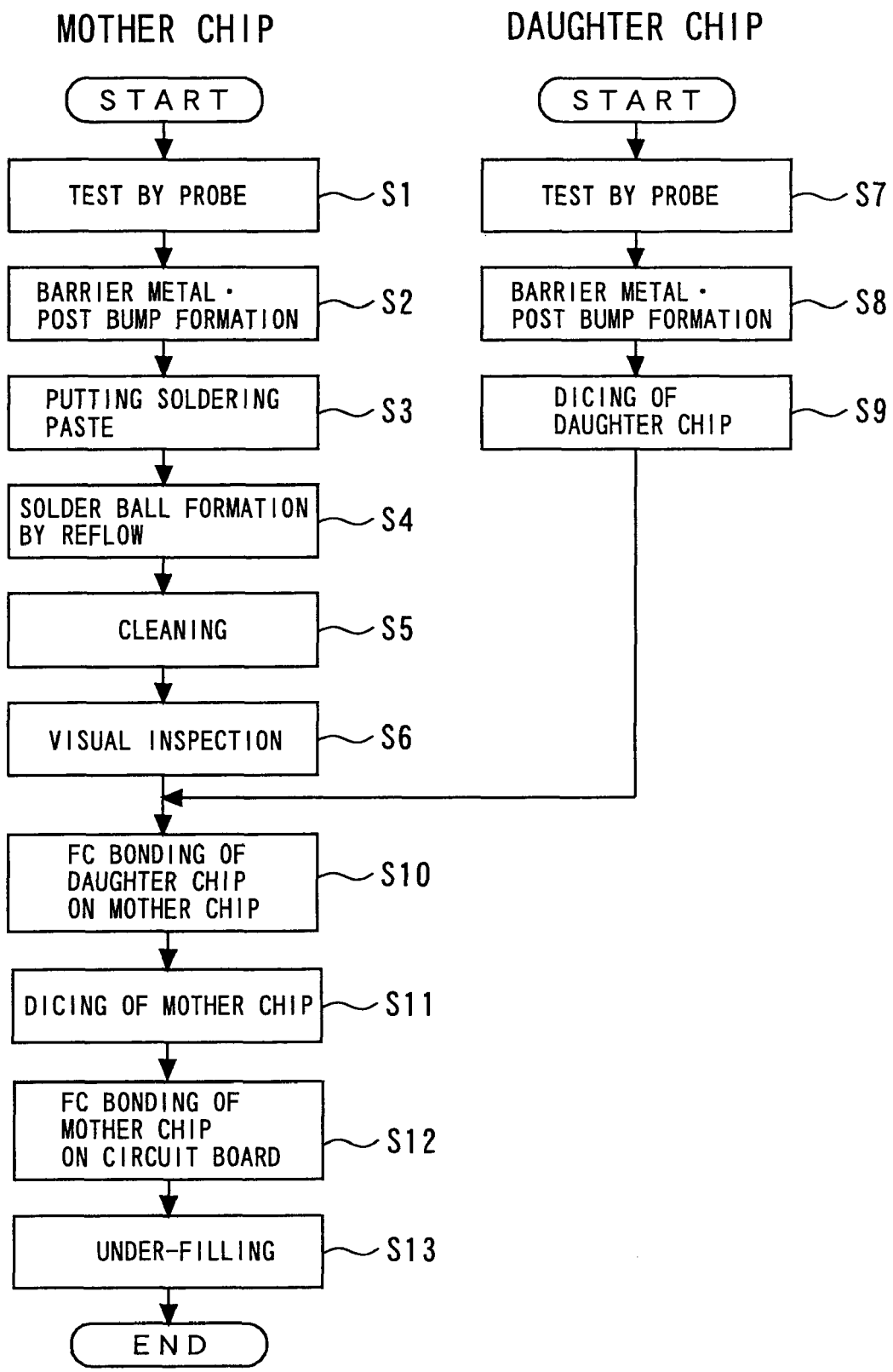
FIG. 1 is a flowchart in which the manufacturing method of the semiconductor device concerning Embodiment 1 of the present invention is shown.

FIG. 1 is a flowchart in which the manufacturing method of the semiconductor device concerning Embodiment 1 of the present invention is shown. The manufacturing method of the semiconductor device concerning Embodiment 1 is explained referring to this flowchart and FIGS. 2A-4B.

Figure 2A:
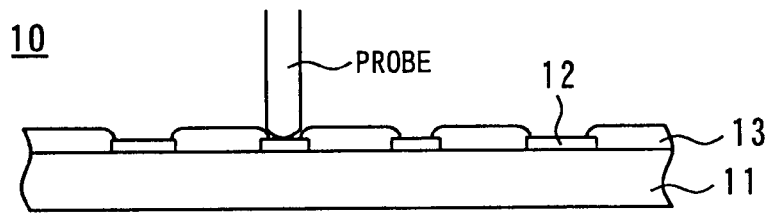
FIGS. 2A-2F are sectional views showing the step which forms solder balls on the circuit face of a mother chip.

First, the manufacturing process of mother chip 10 and the forming step of solders ball are explained. As shown in FIG. 2A, Al electrode 12 is formed on substrate 11 (circuit face), and the other region is covered with passivation film 13. And a test is performed by applying a probe to this Al electrode 12 (step S1). This test is conducted to a plurality of mother chips 10 formed on the wafer, respectively, and the wafer map in which the pass or failure of each mother chip 10 on a wafer is shown is created.

Figure 2B:
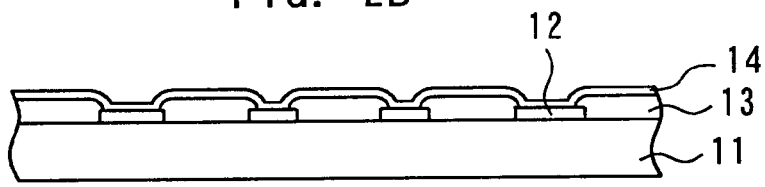
Figure 2C:
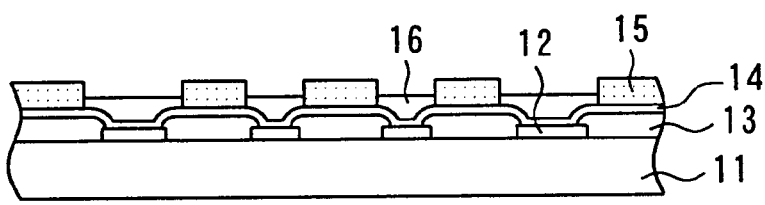
Figure 2D:
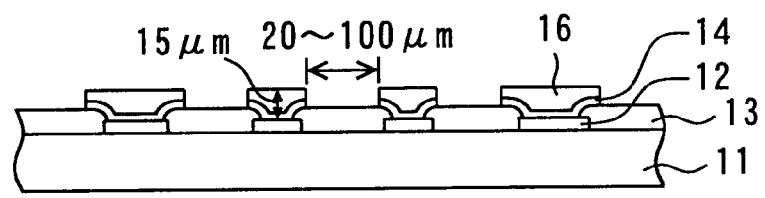

Next, as shown in FIG. 2B, barrier metal 14 including a multilayer, such as Cu, Ni, Cr, and W, is formed in the whole surface with spatter technology or plating technology. And as shown in FIG. 2C, resist 15 having opening to the region to which Al electrode 12 exists is formed, opening of resist 15 is filled up with Cu etc. with plating technology, and metal post 16 is formed. Then, as shown in FIG. 2D, resist 15 is removed and anisotropic etching of the barrier metal 14 is performed by using metal post 16 as a mask (step S2). The thickness of metal post 16 is about 15 μm, and the pitch of metal post 16 each other is 20-100 μm.

Figure 2E:
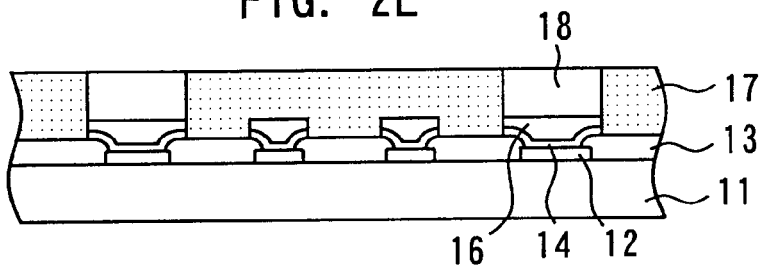
Figure 2F:
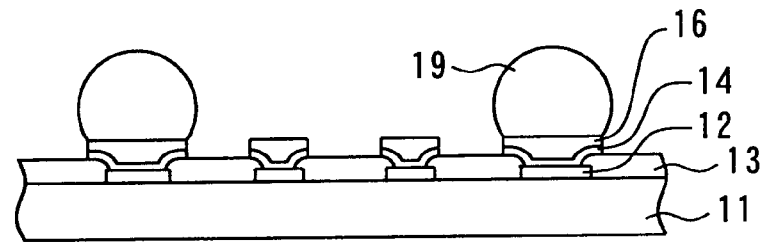

Next, as shown in FIG. 2E, resist 17 which has opening to the region forming a solder ball (after-mentioned) is formed, and opening of resist 17 is filled up with solder paste 18 with plating technology (step S3). If very thin gold plating is given to the surface of metal post 16, since wettability with solder paste 18 is securable, it is desirable.

Next, after removing resist 17, by melting (reflowing) solder paste 18 heating mother chip 10, solder balls 19 are formed (step S4). Then, cleaning (step S5) and a visual inspection (step S6) are conducted. Solder balls are formed on the circuit face of mother chip 10 by the above steps.

Figure 3A:
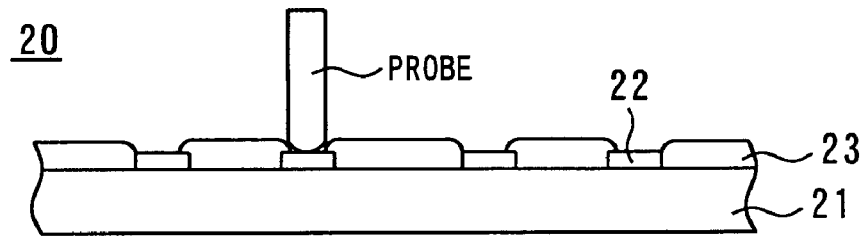
FIGS. 3A-3E are sectional views showing the step which forms a daughter chip.

Next, the manufacturing process of daughter chip 20 is explained. As shown in FIG. 3A, Al electrode 22 is formed on substrate 21 (circuit face), and the other region is covered with passivation film 23. And a test is performed by applying a probe to this Al electrode 22 (step S7). This test is conducted to a plurality of daughter chips 20 formed on the wafer, respectively, and the wafer map in which the pass or failure of each daughter chip 20 on a wafer is shown is created.

Figure 3B:
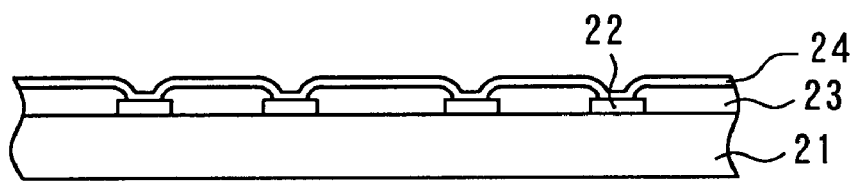
Figure 3C:
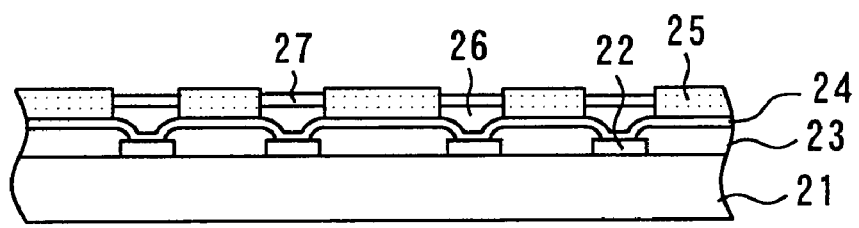
Figure 3D:
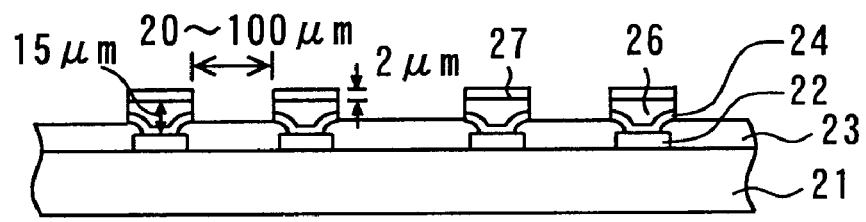

Next, as shown in FIG. 3B, barrier metal 24 including a multilayer, such as Cu, Ni, Cr, and W, is formed in the whole surface with spatter technology or plating technology. And as shown in FIG. 3C, resist 25 having opening to the region to which Al electrode 22 exists is formed, opening of resist 25 is filled up with Cu etc. with plating technology, metal post 26 is formed, and joining member 27 of solder etc. is formed on it. Then, as shown in FIG. 3D, resist 25 is removed and anisotropic etching of the barrier metal 24 is performed by using metal post 26 and joining member 27 as a mask (step S8). The thickness of metal post 26 is about 15 μm, and the pitch of metal post 26 each other is 20-100 μm.

Figure 3E:
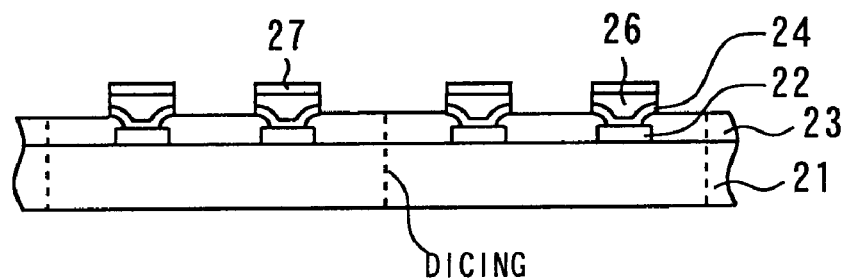

Next, as shown in FIG. 3E, a plurality of daughter chips 20 formed on the wafer are individually separated by dicing (step S9). Daughter chip 20 is formed by the above steps. As daughter chip 20, passive devices, such as a chip capacitor, and active devices, such as a memory, can be used.

Next, the step making flip chip bonding of the daughter chip on the circuit face of the mother chip, and the step making flip chip bonding of the mother chip at the circuit board are explained.

First, flip chip bonding of the daughter chip 20 which passed by the probe test of step S7 is made on the circuit face of mother chip 10 which passed the test by the probe test of step S1, and the visual inspection of step S6 (step S10).

Figure 4A:
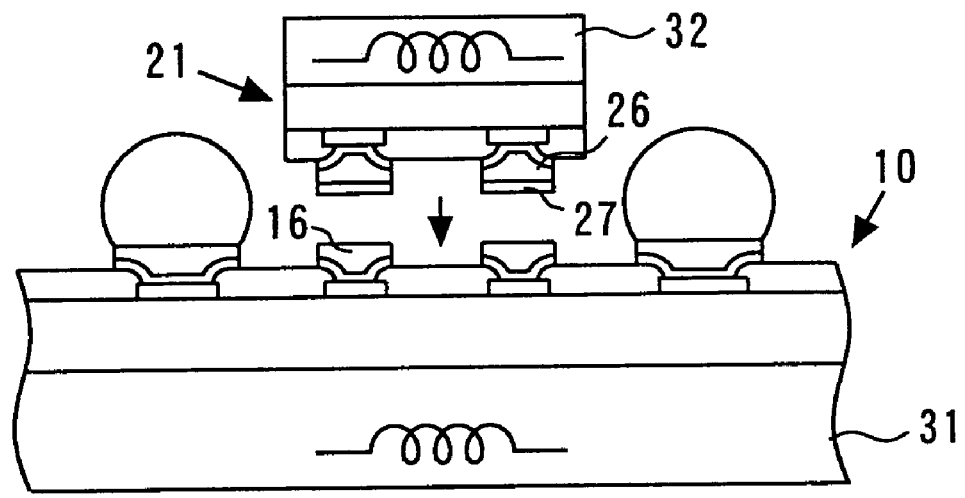
FIGS. 4A and 4B are sectional views showing the step which makes flip chip bonding of the daughter chip on the circuit face of a mother chip, and the step which makes flip chip bonding of the mother chip at a circuit board.

Concretely, first, as shown in FIG. 4A, mother chip 10 is put on stage 31, daughter chip 20 is held by handle part 32, and a mutual circuit face is opposed. And heating daughter chip 20 with the heater formed in handle part 32 to higher temperature than the melting point (183° C.) of solder, for example, 300° C., metal post 16 formed on mother chip 10 and metal post 26 formed on daughter chip 20 are made to bond by thermo-compression via joining member 27. Since joining member 27 inserted in metal posts 16 and 26 including material which is not melted changes a lot and melts by this, the surface oxide film of joining member 27 is destroyed, and good joining is acquired by fluxless.

However, in the case of this thermo compression bonding, the heater formed in stage 31 is adjusted so that temperature of mother chip 10 may be made lower than the melting point of solder ball 19, for example, 100° C.-150° C., not to make solder ball 19 remelt. Thereby, the oxidation of the surface of solder balls 19 by remelting and the link of solder ball 19 each other can be prevented. Although flip chip bonding of the daughter chip 20 is made maintaining at high temperature rather than the melting point of solder, mother chip 10 has good heat conduction, heat spreads, and since stage 31 in which mother chip 10 is installed has large heat capacity, the rise of temperature is suppressed.

Figure 4B:
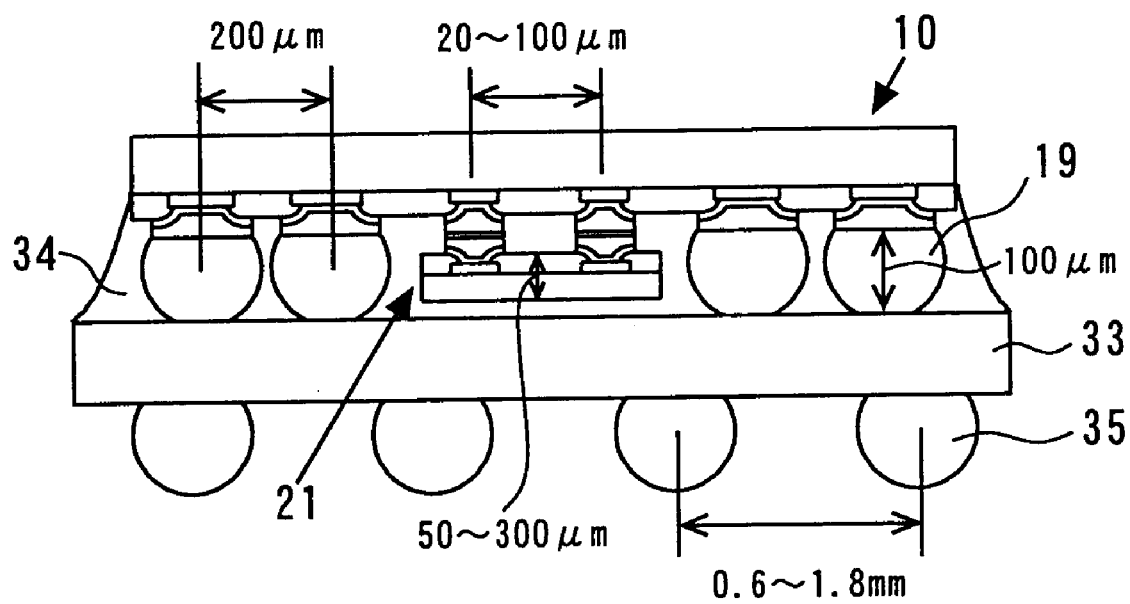

Next, a plurality of mother chips 10 formed on the wafer are individually separated by dicing (step S11). And as shown in FIG. 4B, flip chip bonding of mother chip 10 is made on circuit board 33 via solder balls 19 (step S12). As circuit board 33, a multilayer organic substrate, a silicon interposer, a chip, etc. can be used.

Then, under-filling is performed by pouring in resin 34 between mother chip 10 and circuit board 33 (step S13). Outer balls 35 are formed in the underside of circuit board 33 for external connection.

By the above steps, the semiconductor device with which flip chip bonding of the daughter chip 20 was made on the circuit face of mother chip 10, and flip chip bonding of this mother chip 10 was made at the circuit board is manufactured. In this semiconductor device, spacing of solder ball 19 each other is about 200 μm, spacing of metal post 16 (or metal post 26) each other is 20-100 μm, the thickness of daughter chip 20 is 50-300 μm, the diameter of a solder ball is 100 μm, and spacing of outer ball 35 each other is 0.6-1.8 mm.

As explained above, since solder balls are formed in the phase with little irregularity before making flip chip bonding of the daughter chip 20 on the circuit face of mother chip 10, the solder ball formation method of single wafer processing can be used. For this reason, the solder balls used in order to make flip chip bonding of the mother chip 10 on a circuit board can be formed efficiently.

Sn can be used as joining member 27, using Cu as metal posts 16 and 26. In this case, joining member 27 becomes CuSn alloy by thermo compression bonding. Or SnAg (melting point 212° C.) may be used as joining member 27, using Ni as metal post 26, using Cu as metal post 16. By performing Au plating to the metal post surface to which a joining member is connected, it is good to secure wettability.

Metal posts 16 and 26 can also be connected by carrying out surface cleaning treatment like plasma treatment. In this case, it is not necessary to destroy a surface oxide film according to deformation of joining member 27 on which the big pressure was put, and they are joinable even if the amount of joining member 27 is reduced. And the leakage of joining member 27 to the side face of metal posts 16 and 26 can be decreased, and the height of metal posts 16 and 26 can be made thin. Thereby, since spacing of mother chip 10 and daughter chip 20 can be narrowed, the stress by the thermal expansion of the resin between chips can be reduced.

Embodiment 2

The manufacturing method of the semiconductor device concerning Embodiment 2 differs in the step which deposits solder paste on the circuit face of mother chip 10 from the FIG. 2E of Embodiment 1. Other steps are the same as that of Embodiment 1.

Figure 5:
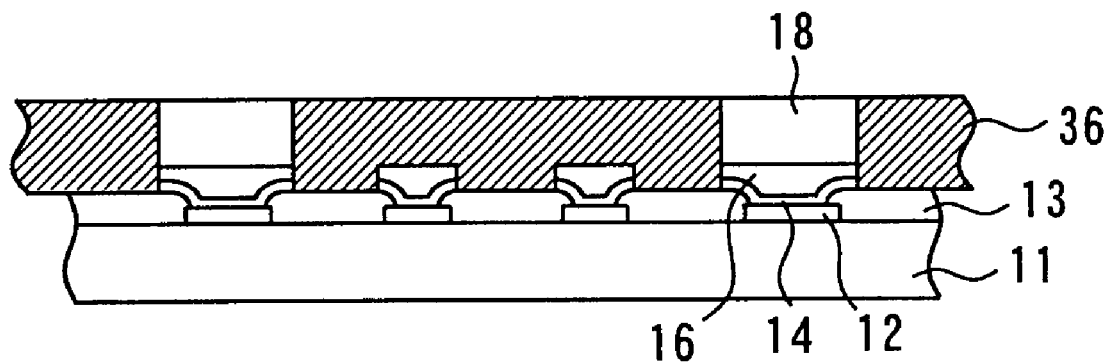
FIG. 5 is a sectional view showing the semiconductor device concerning Embodiment 2 of the present invention.

That is, as for Embodiment 2, as shown in FIG. 5, metal mask 36 is laid on top of the circuit face of mother chip 10 so that the region which forms a solder ball, and opening may fit in, and it is filled up by printing solder paste 18 to the opening of metal mask 36. Then, metal mask 36 is removed, and like FIG. 2F, by melting solder paste heating mother chip 10, solder balls are formed.

Thus, in the step which forms solder balls on the circuit face of mother chip 10, even if it uses metal mask 36 instead of using resist 17 like Embodiment 1, the same effect as Embodiment 1 can be acquired.

Embodiment 3

The manufacturing method of the semiconductor device concerning Embodiment 3 differs in the step which makes flip chip bonding of the daughter chip 20 on the circuit face of mother chip 10 from the FIG. 4A of Embodiment 1. Other steps are the same as that of Embodiment 1.

Figure 6:
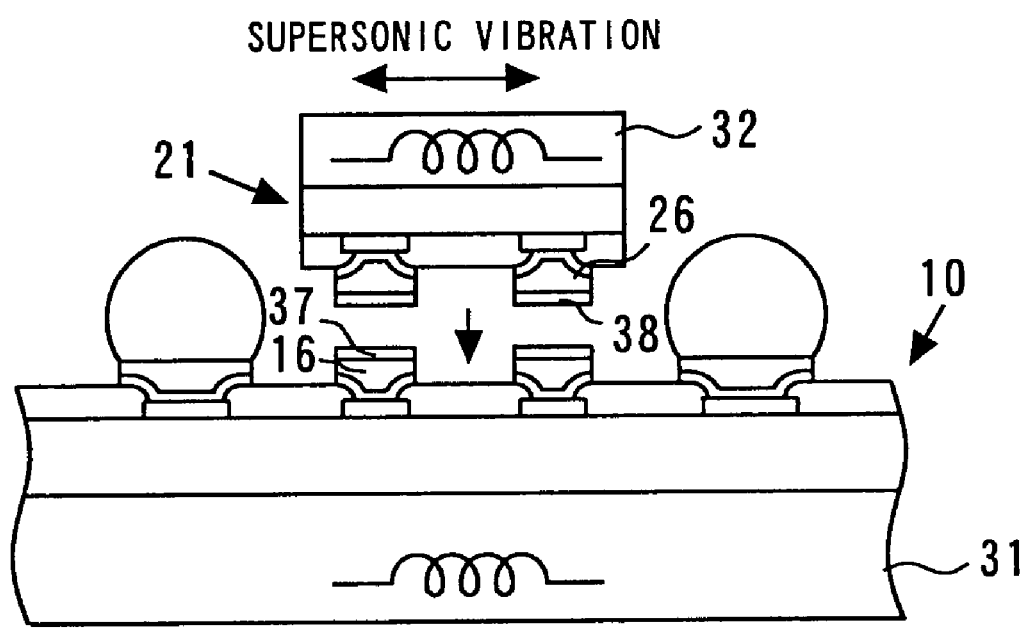
FIG. 6 is a sectional view showing the semiconductor device concerning Embodiment 3 of the present invention.

That is, in Embodiment 3, as shown in FIG. 6, metal posts 16 and 26 include Ni, and Au films 37 and 38 are formed on the surface of both, respectively. Or metal posts 16 and 26 may include Au. In the condition of maintaining mother chip 10 and daughter chip 20 at 150° C., supersonic vibration is applied to daughter chip 20, and the metal post formed on mother chip 10 and the metal post formed on daughter chip 20 are made to bond by thermo-compression with supersonic vibration.

Thus, since thermo compression bonding is possible at temperature lower than Embodiment 1 by applying supersonic vibration, oxidation of the surface of solder balls 19 by remelting and the link of solder ball 19 each other can be prevented.

Embodiment 4

Figure 7:
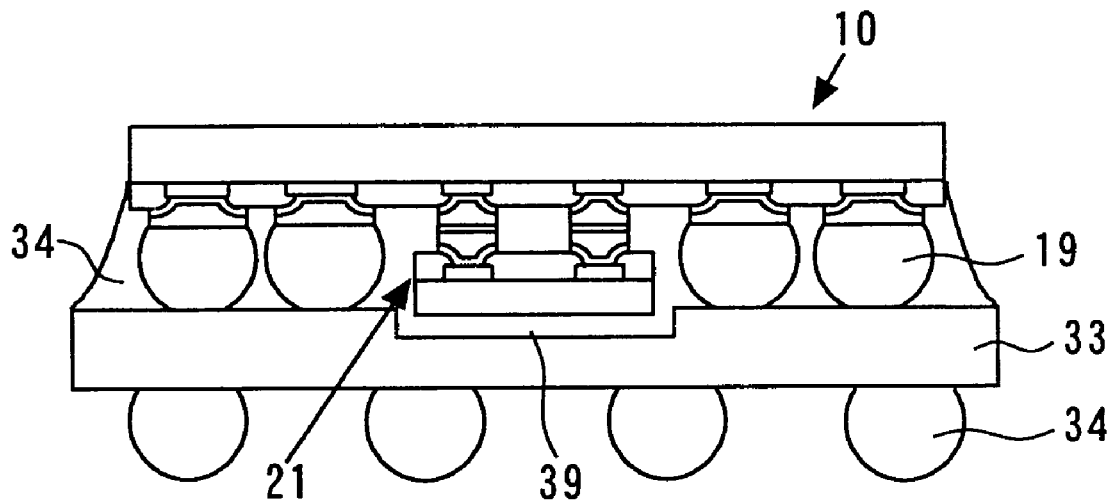
FIG. 7 is a sectional view showing the semiconductor device concerning Embodiment 4 of the present invention.

FIG. 7 is a sectional view showing the semiconductor device concerning Embodiment 4 of the present invention. As for this semiconductor device, depressed portion 39 is formed in the region corresponding to daughter chip 20 on the top face of circuit board 33. Other structure is the same as that of Embodiment 1. Thereby, even when daughter chip 20 is thick, flip chip bonding of mother chip 10 and circuit board 33 can be made good.

Embodiment 5

Figure 8:
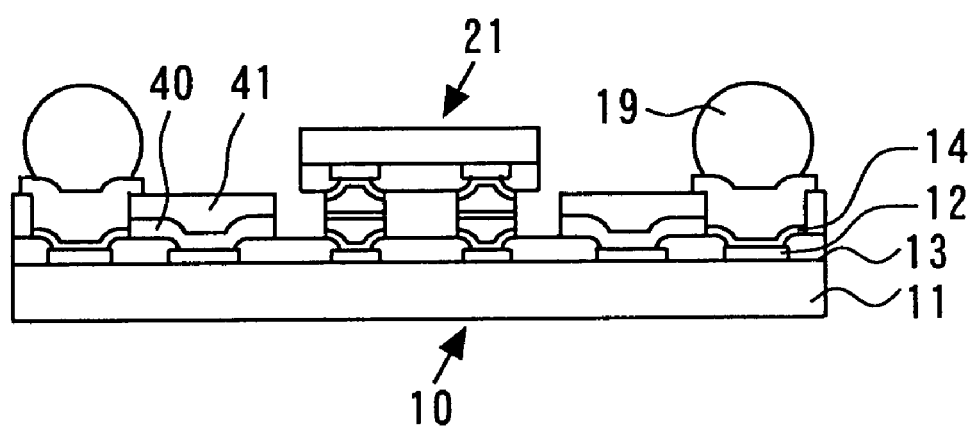
FIG. 8 is a sectional view showing the semiconductor device concerning Embodiment 5 of the present invention.

FIG. 8 is a sectional view showing the semiconductor device concerning Embodiment 5 of the present invention. As for this semiconductor device, rewiring layer 40 is formed on the circuit face of mother chip 10 of the present invention, and its top is covered with passivation film 41. However, it is made not to form rewiring layer 40 and passivation film 41 in the region which connects daughter chip 20. Thereby, since the height of metal posts 16 and 26 is securable, when underfilling, it becomes easy to pour in resin 34 between chips.

Embodiment 6

Figure 9:
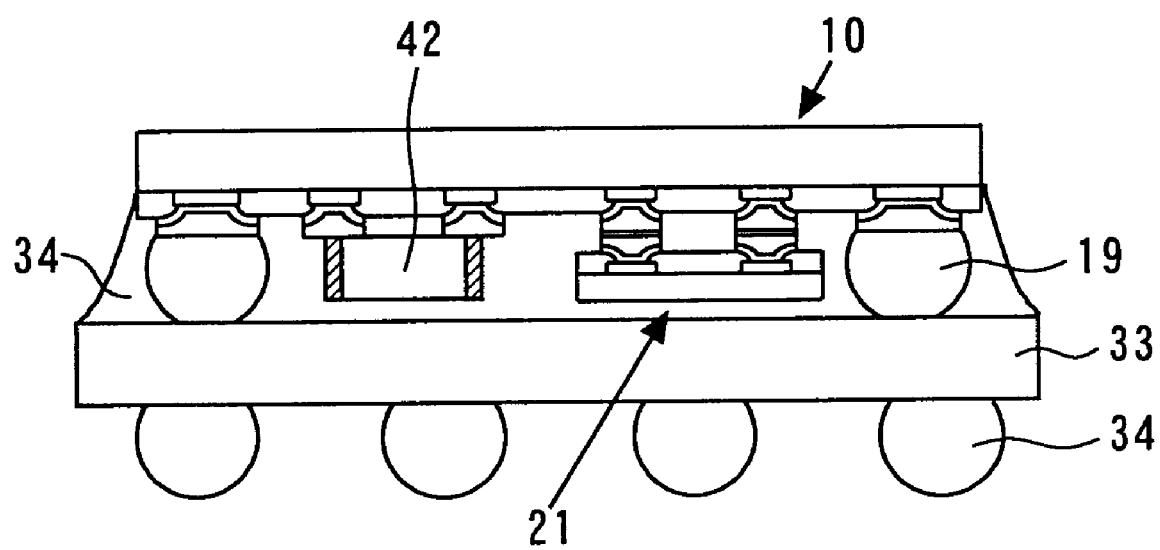
FIG. 9 is a sectional view showing the semiconductor device concerning Embodiment 6 of the present invention.

FIG. 9 is a sectional view showing the semiconductor device concerning Embodiment 6 of the present invention. As for this semiconductor device, chip capacitor 42 other than daughter chip 20 is mounted on the circuit face of mother chip 10. Other structure is the same as that of Embodiment 1.

Thus, also when a passive device, such as a chip capacitor, and an active device are loaded together on mother chip 10, the present invention can be applied, and the same effect can be acquired.

Flip chip bonding of the two or more daughter chips 20 may be made at mother chip 10. In this case, a flash memory and DRAM can be used as daughter chips 20, for example.

As things mentioned above, the present inventions accomplished by the present inventors were concretely explained based on above embodiments, but the present inventions are not limited by above embodiments, but variations and modifications may be made, of course, in various ways in the limit that does not deviate from the gist.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2004-369230, filed on Dec. 21, 2004 including specification, claims, drawings and summary, on which the Convention priority of the present application is based, are incorporated herein by reference in its entirety.

What is claimed is:

1. A manufacturing method of a semiconductor device, comprising the steps of:
    preparing a mother chip and a daughter chip,
    the mother chip including a first substrate
    first electrodes and second electrodes,
    a first passivation film formed on the first substrate and having openings exposing upper surfaces of the first and second electrodes;
    first barrier metal formed on the upper surface of the first and second electrodes, respectively, and on the first passivation film,
    first metal posts formed on the first barrier metal of the first and second electrodes, respectively, and
    solder balls on the first metal posts above the first electrodes;
    the daughter chip including a second substrate
    third electrodes,
    a second passivation film formed on the second substrate and having openings exposing upper surfaces of the third electrodes;
    second barrier metal formed on the upper surface of the third electrodes, respectively, and on the second passivation film;
    second metal posts on the second barrier metal of the third electrodes, respectively, and
    making flip chip bonding of a daughter chip on the mother chip to electrically connect the second metal posts to the first metal posts for the second electrodes, respectively, and making flip chip bonding of the mother chip on a circuit board using the solder balls.

2. The manufacturing method of a semiconductor device according to claim 1, wherein an upper surface of the first passivation film is made higher relatively to the upper surfaces of the first and second electrodes, and the whole of the upper surface of each first metal post is made higher relatively to the upper surface of the first passivation film;
    wherein an upper surface of the second passivation film is made higher relatively to the upper surfaces of the third electrodes, and the whole of the upper surface of each second metal post is made higher relatively to the upper surface of the second passivation film.

3. The manufacturing method of a semiconductor device according to claim 1, wherein the step of making flip chip bonding of the daughter chip includes the step of heating joint members of solder provided between the second metal posts and the first metal posts.

4. The manufacturing method of a semiconductor device according to claim 3, before the step of making flip chip bonding of the daughter chip, the joint members of solder is formed on the second metal posts.

* * * * *